(12) United States Patent
Takekoshi

(10) Patent No.: US 7,602,203 B2
(45) Date of Patent: Oct. 13, 2009

(54) PROBE AND PROBE CARD

(75) Inventor: Kiyoshi Takekoshi, Nirasaki (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 11/885,426

(22) PCT Filed: Mar. 1, 2006

(86) PCT No.: PCT/JP2006/303860

§ 371 (c)(1),
(2), (4) Date: Aug. 31, 2007

(87) PCT Pub. No.: WO2006/093185

PCT Pub. Date: Sep. 8, 2006

(65) Prior Publication Data

US 2008/0164892 A1 Jul. 10, 2008

(30) Foreign Application Priority Data

Mar. 3, 2005 (JP) ............................. 2005-059568

(51) Int. Cl.
*G01R 31/02* (2006.01)
(52) U.S. Cl. .................. 324/757; 324/758; 324/761
(58) Field of Classification Search ................ 324/754, 324/761
See application file for complete search history.

(56) References Cited

U.S. PATENT DOCUMENTS

| 3,865,462 A | * | 2/1975 | Cobaugh et al. | ............ 439/748 |
| 5,557,213 A | * | 9/1996 | Reuter et al. | ................ 324/761 |
| 6,859,054 B1 | * | 2/2005 | Zhou et al. | ................... 324/754 |
| 7,134,909 B2 | * | 11/2006 | Baba et al. | ................... 439/557 |
| 2001/0024890 A1 | * | 9/2001 | Maruyama et al. | ............ 439/66 |
| 2002/0000821 A1 | * | 1/2002 | Haga et al. | ................... 324/761 |
| 2002/0048973 A1 | * | 4/2002 | Zhou et al. | ..................... 439/66 |
| 2003/0176066 A1 | * | 9/2003 | Zhou et al. | ................... 438/689 |

FOREIGN PATENT DOCUMENTS

| JP | 9-219268 | 8/1997 |
| JP | 2001-305182 | 10/2001 |
| JP | 2003-215161 | 7/2003 |
| WO | WO 03/025589 A1 | 3/2003 |

* cited by examiner

*Primary Examiner*—Ha Tran T Nguyen
*Assistant Examiner*—Karen M Kusumakar
(74) *Attorney, Agent, or Firm*—Finnegan, Henderson, Farabow, Garrett & Dunner, L.L.P.

(57) ABSTRACT

An object of the present invention is to make it possible that a probe for testing electrical characteristics of an object to be tested is easily attached to a support member such as a contactor. A through hole is formed in the contactor. In the probe, a fitting/locking portion which can be fitted in this through hole is formed. The fitting/locking portion is formed to penetrate the through hole of the contactor and to be locked in the contactor in a state that a tip thereof is in contact with a connecting terminal of a printed wiring board. The fitting/locking portion itself is locked in the contactor by hooking a locking portion thereof to an end face on an upper side of the through hole.

11 Claims, 7 Drawing Sheets

PROBE AND PROBE CARD

TECHNICAL FIELD

The present invention relates to a probe and a probe card for testing electrical characteristics of an object to be tested.

BACKGROUND ART

Testing of electrical characteristics of an electronic circuit such as IC, LSI and the like formed on a semiconductor wafer for example is performed using a probe card attached to a probe apparatus. The probe card normally has a contactor which supports a large number of probes, and a circuit board connected electrically to the contactor. The contactor is arranged so that a lower face on which the probes are supported faces a wafer, and the circuit board is stacked and arranged on an upper face of the contactor. Testing of electrical characteristics of the wafer is performed by bringing the plurality of probes into contact with electrodes of the electronic circuit on the wafer, and applying an electrical signal for testing from the respective probes to the electrodes of the electronic circuit on the wafer via the circuit board and the contactor.

Conventionally, the plurality of probes described above are joined by ultrasonic bonding, soldering, laser bonding, or the like to connecting terminals exposed on the lower face of the contactor (refer to Patent Document 1). However, when each probe is joined to the contactor as in a conventional manner, it is necessary to join each probe by bringing a bonding tool for joining for example into contact with a joint portion of each of the probes, and thereby a long time is needed for joining all the probes to the contactor. Also, it is necessary to use an apparatus for joining such as the bonding tool, and hence joining of the probes cannot be performed easily. Further, when each probe is joined to the contactor by ultrasonic bonding or soldering as in a conventional manner, in the case where a probe is damaged for example, the probe cannot be detached easily from the contactor, thereby requiring a substantial time for maintenance.

[Patent Document 1] Japanese Patent Application Laid-open No. 2003-215161

DISCLOSURE OF THE INVENTION

Problems to Be Solved by the Invention

The present invention is made in view of such problems, and an object thereof is to provide a probe which can be attached to a support member such as a contactor easily within a short time and a probe card including the probe.

Means for Solving the Problems

To achieve the above-described object, the present invention is a probe for testing electrical characteristics of an object to be tested, wherein the probe is supported by a support member facing the object to be tested, and is constructed to be freely attachable to the support member by locking in the support member.

According to the present invention, since the probe can be attached to the support member by locking therein, it is not necessary to join the probe to the support member using a bonding tool for example as in a conventional manner, and attaching of the probe can be performed easily within a short time. Also, detaching of the probe can be performed relatively easily, and hence replacing of the probe or the like for example can be performed easily.

The probe may have a fitting/locking portion which is fitted into a hole formed in the support member and is locked therein.

The fitting/locking portion may be formed of an electrically conductive material, and may be formed to penetrate the hole in the support member from a side of the object to be tested to an opposite side and to project from a face of the opposite side of the support member. In this case, for example it is possible to bring the projecting portion of the fitting/locking portion into contact with a connection terminal of a circuit board to allow electrical conduction between the circuit board and the probe.

On a tip of a projecting portion of the fitting/locking portion, a member formed of an electrically conductive material and having elasticity may be attached. In this case, deformation of a circuit board due to heat for example can be absorbed by bringing this member having elasticity into contact with the circuit board for example. Therefore, if the circuit board deforms for example, deformation of the probe due to the deformation of the circuit board can be prevented while keeping electrical conduction between the probe and the circuit board.

The fitting/locking portion may be formed of an electrically conductive material, and to the fitting/locking portion, there may be connected a conduction member which is formed of an electrically conductive material, further passes through the hole in the support member and projects from a face of the support member opposite to a side of the object to be tested. Also, the conduction member may have elasticity.

The conduction member may be formed in a sine wave form along the projecting direction.

The above-described probe may have a probe needle which has an upper end connected to the fitting/locking portion and a lower end for contact with the object to be tested, wherein the probe needle may curve to project in a horizontal direction between the upper end and the lower end.

The present invention according to another aspect is a probe card having a support member supporting a probe on one face and a circuit board facing the other face of the support member, wherein the probe is constructed to be freely attachable to the support member by locking in the support member, and is constructed to electrically conduct with the circuit board when attached to the support member.

According to the present invention, since the probe can be attached to the support member by locking therein, it is not necessary to join the probe to the support member using a bonding tool for example as in a conventional manner, and attaching of the probe can be performed easily within a short time. Also, detaching of the probe can be performed relatively easily, and hence replacing of the probe or the like for example can be performed easily.

The probe may have a fitting/locking portion which is fitted into a hole formed in the support member and is locked therein. Also, the fitting/locking portion may be formed of an electrically conductive material, and may penetrate the hole in the support member from one face side to the other face side, project from the other face of the support member, and be in contact with the circuit board. Further, on a tip of a projecting portion of the fitting/locking portion, a member formed of an electrically conductive material and having elasticity may be attached.

The fitting/locking portion may be formed of an electrically conductive material, and to the fitting/locking portion, there may be connected a conduction member which is formed of an electrically conductive material, further passes through the hole in the support member, projects from the other face of the support member and comes in contact with the circuit board.

The conduction member may have elasticity. Also, the conduction member may be formed in a sine wave form proceeding from the one face side to the other face side of the support member.

The probe card may have a probe needle which has an upper end connected to the fitting/locking portion and a lower end for contact with the object to be tested, wherein the probe needle may curve to project in a horizontal direction between the upper end and the lower end.

A through hole having a quadrangular shape may be formed in the support member, the fitting/locking portion may have a base portion, a fitting portion connected to the base portion and fitted into the through hole, and a locking portion which is formed in the fitting portion and locked in the support member, and the fitting portion may be formed in two plate shapes facing each other, which are fitted along inner wall faces facing each other in the through hole. In this case, since the square hole is formed in the support member and the probe can be attached to the square hole, the probe can be attached to the support member with the gap between probes being narrowed as compared to the case of a circular hole.

The locking portion may be locked in the support member by hooking to an end face on the other face side in the through hole.

EFFECT OF THE INVENTION

According to the present invention, a probe can be attached to a contactor easily within a short time, and production of a probe card becomes easy.

Figure 1:
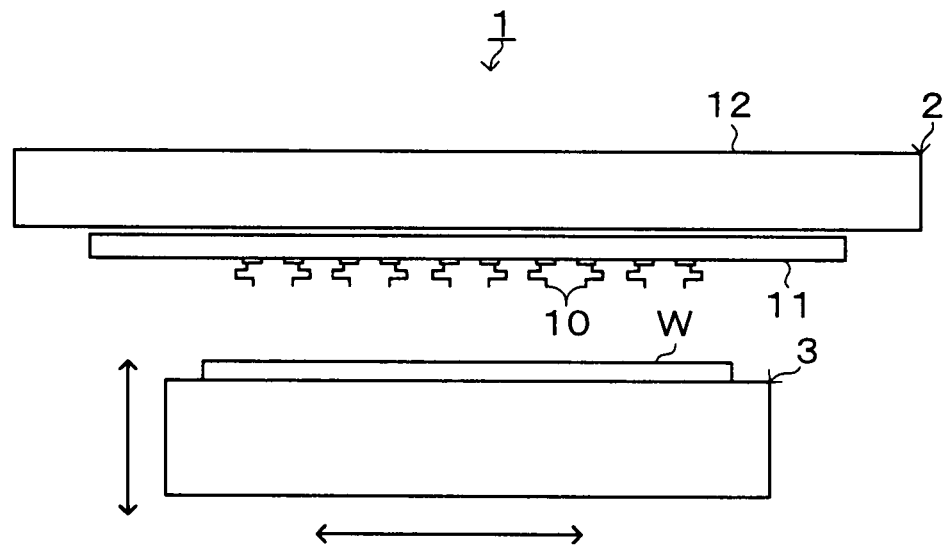
FIG. 1 A side view showing an overview of a structure of a probe apparatus.

EXPLANATION OF CODES 1 probe apparatus
2 probe card
10 probe
11 contactor
12 printed wiring board
12a connecting terminal
20 through hole
30 fitting/locking portion
31 probe needle
W wafer

BEST MODES FOR CARRYING OUT THE INVENTION

Hereinafter, a preferred embodiment of the present invention will be explained. FIG. 1 is an explanatory view of a vertical cross-section showing an overview of a structure of a probe apparatus 1.

The probe apparatus 1 is provided with, for example, a probe card 2 and a mounting table 3 which mounts a wafer W as an object to be tested. The probe card 2 includes, for example, a contactor 11 as a support member supporting a plurality of probes 10 and a printed wiring board 12 as a circuit board for sending/receiving an electrical signal to/from the probes 10. The contactor 11 is provided so as to face the mounting table 3, and the printed wiring board 12 is provided on the contactor 11.

Figure 2:
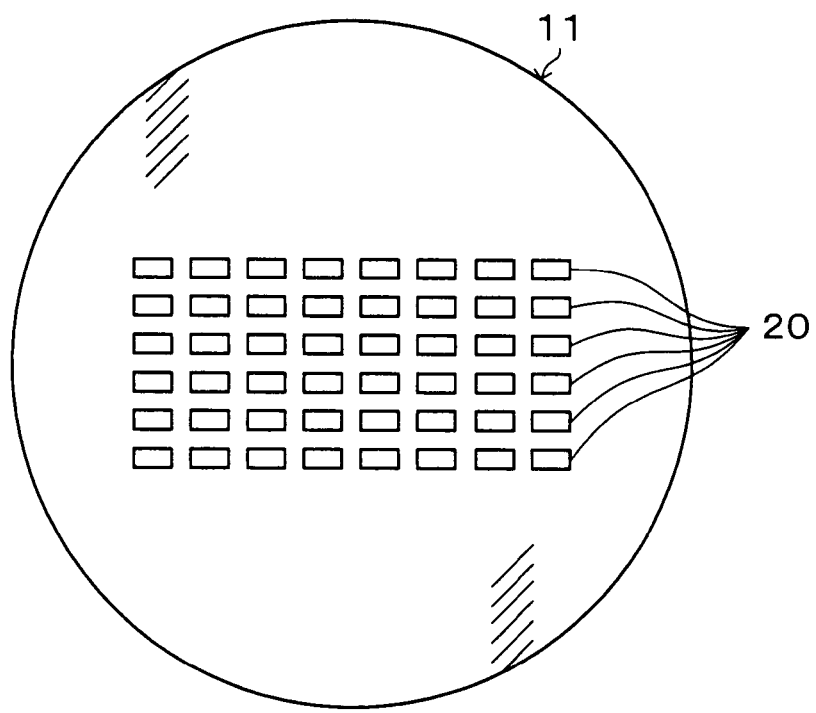
FIG. 2 A plan view of a contactor in a state that a probe is not attached.

The contactor 11 is formed in a substantially disc shape for example, and on a central portion facing the wafer W on the mounting table 3, a plurality of through holes 20 are formed as shown in FIG. 2. Each through hole 20 is formed for example in a quadrangular shape in plan view. The through holes 20 are aligned and formed for example in two orthogonal directions. The probes 10 are fitted in these through holes 20 to be supported therein.

Figure 3:
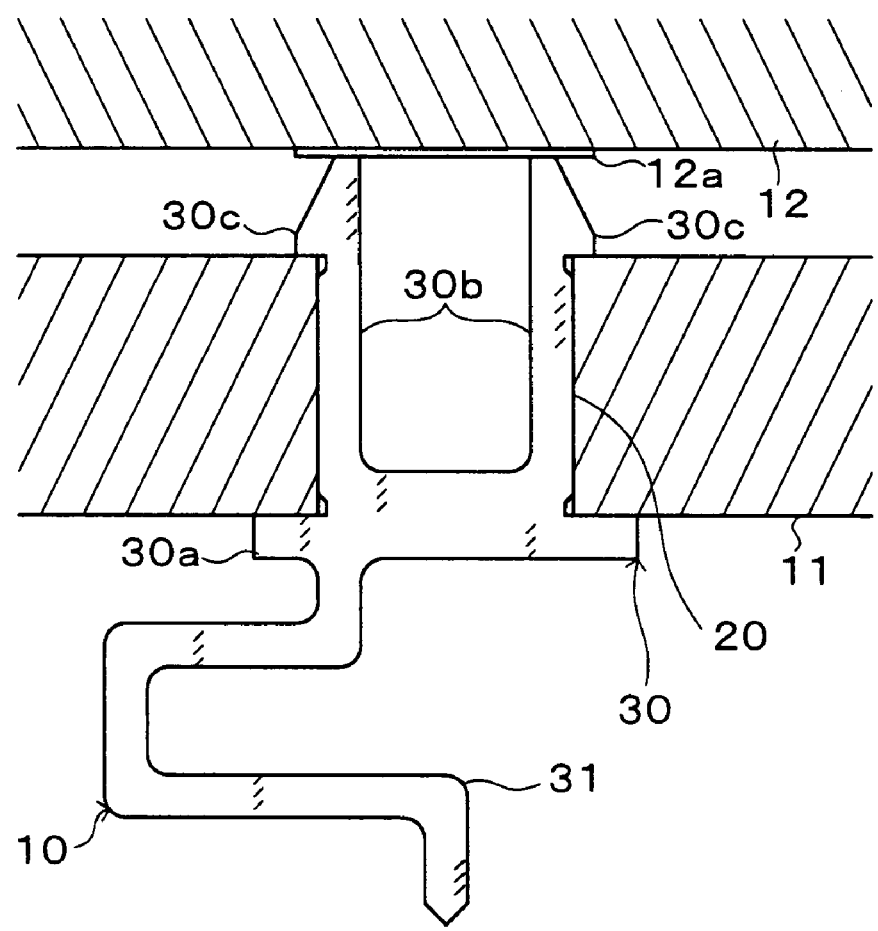
FIG. 3 An explanatory view of a cross-section showing an overview of a probe and a structure of an attaching portion of the probe.

The printed wiring board 12 is formed for example in a substantially disc shape. The printed wiring board 12 is arranged so that a small gap is formed between the printed wiring board 12 and the contactor 11 as shown in FIG. 3. On a lower face of the printed wiring board 12, at a position facing a through hole 20 of the contactor 11, a connecting terminal 12a connecting to wiring in the printed wiring board 12 is formed.

Figure 4:
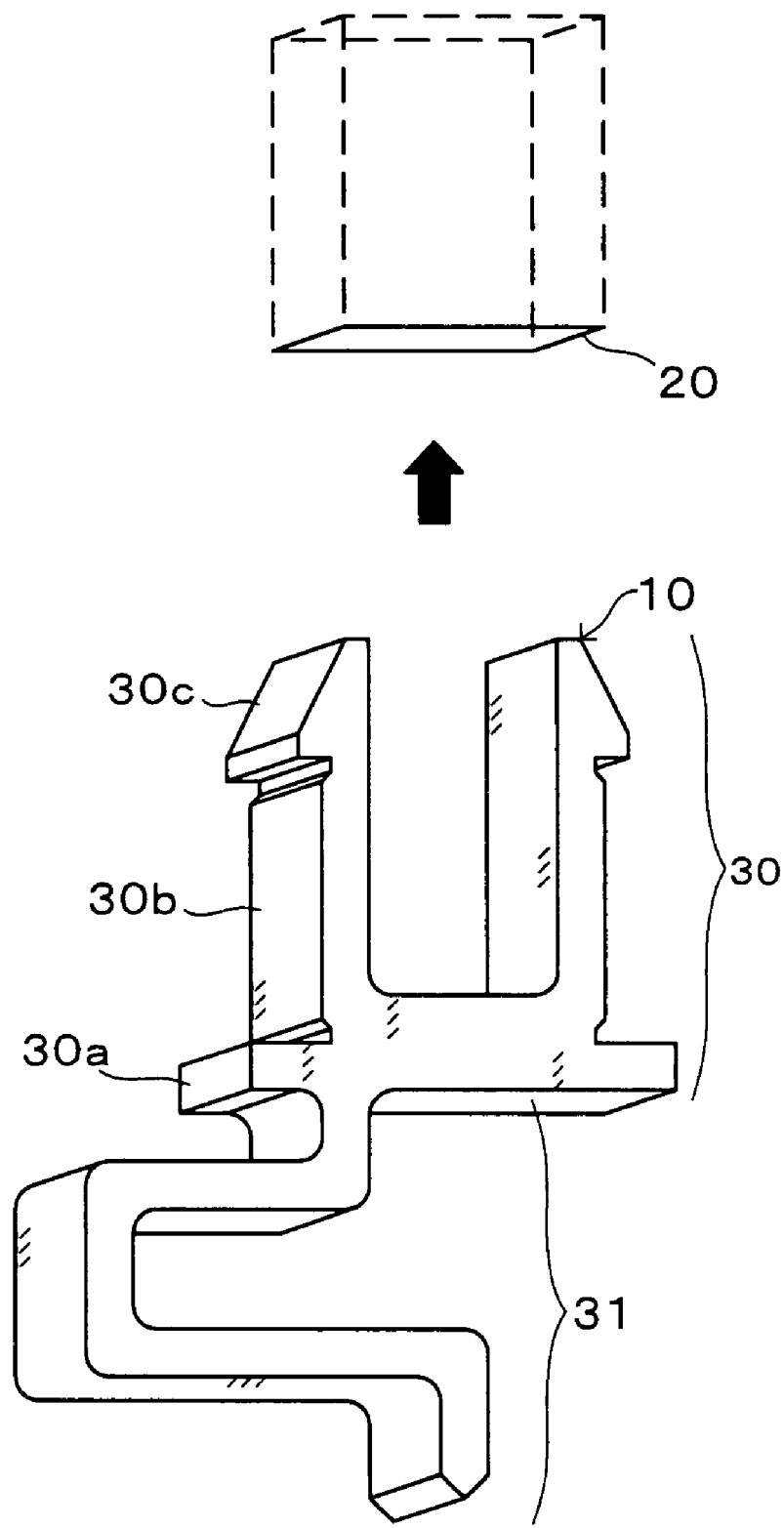
FIG. 4 A perspective view of the probe.

The probes 10 are formed of an electrically conductive material such as metal for example. A probe 10 includes, as shown in FIG. 3 and FIG. 4 for example, a fitting/locking portion 30 which is fitted in a through hole 20 of the contactor 11 and locked therein, and a probe needle 31 for contact with the wafer W on the mounting table 3. For example, the fitting/locking portion 30 includes a base portion 30a, fitting portions 30b formed to proceed in a perpendicular direction from the base portion 30a, and locking portions 30c formed in tip portions of the fitting portions 30b.

The base portion 30a has for example a plate shape, which is a quadrangle that is the same as the through hole 20, and is slightly larger than an opening portion in a longitudinal direction of the through hole 20. When the fitting/locking portion 30 of the probe 10 is fitted into the through hole 20, this base portion 30a abuts on an end face (lower face of the contactor 11) on an entrance side of the through hole 20 and can exhibit a function as a stopper.

The fitting portions 30b are constituted of two substantially quadrangular plates facing each other for example, and are provided to stand in parallel on the base portion 30a. The fitting portions 30b have flexibility and elasticity in a direction in which the two plates facing each other. The fitting portions 30b have a gap between the two plates, which is set to a size that is substantially the same as the diameter in a longitudinal direction of the through hole 20, and are formed so that the fitting portions 30b come in close contact with two inner faces facing each other in the through hole 20 when fitted into the through hole 20.

The locking portions 30c are formed on tips of the fitting portions 30b, and project for example upward from an end face (upper face of the contactor 11) on an exit side of the through hole 20. For example, tips of the locking portions 30c are formed flatly, and come in contact with the connecting terminal 12a of the printed wiring board 12 when the fitting/locking portion 30 is fitted into the through hole 20. The locking portions 30c have for example a part projecting outward, and this projecting part can be hooked on the end face on the exit side of the through hole 20 so as to lock the entire probe 10 in the contactor 11.

The probe needle 31 has an upper end connected to a lower face of the base portion 30a of the fitting/locking portion 30a. The probe needle 31 is formed to proceed downward from the upper end and curve thereafter in a rectangular shape in a horizontal direction, and has a lower end formed to proceed downward. With such a shape, the probe needle 31 has elasticity in a vertical direction.

The mounting table 3 is constituted to be freely movable leftward/rightward and upward/downward for example, and can three-dimensionally move the mounted wafer W and bring the probe 10 of the probe card 2 into contact with a desired position on the wafer W.

During manufacturing of the probe card of the probe apparatus 1 constructed as above, the probe 10 is fitted into each through hole 20 of the contactor 11 from a lower side. At this time, a tip of the fitting/locking portion 30 abuts the connecting terminal 12a of the printed wiring board 12, and thereby the printed wiring board 12 and the probe 10 are conducted electrically. Also, the locking portion 30c of the fitting/locking portion 30 is hooked on the upper face of the contactor 11, and the probe 10 is locked in the contactor 11.

Then, when testing the wafer W with the probe apparatus 1, the probe 10 attached to the contactor 11 comes in contact with the wafer W mounted on the mounting table 3, and an electrical signal is given to the wafer W via the probe 10 from the printed wiring board 12 so as to test electrical characteristics of the electronic circuit on the wafer W.

According to the above embodiment, since the probe 10 is locked in the contactor 11 and is made freely attachable to the contactor 11, it is not necessary to join using a bonding tool as in conventional ultrasonic bonding, and hence a large number of probes 10 can be attached to the contactor 11 easily within a short time. Further, if a probe 10 is damaged, the probe 10 can be replaced easily, and such maintenance can be performed also within a short time.

Figure 5:
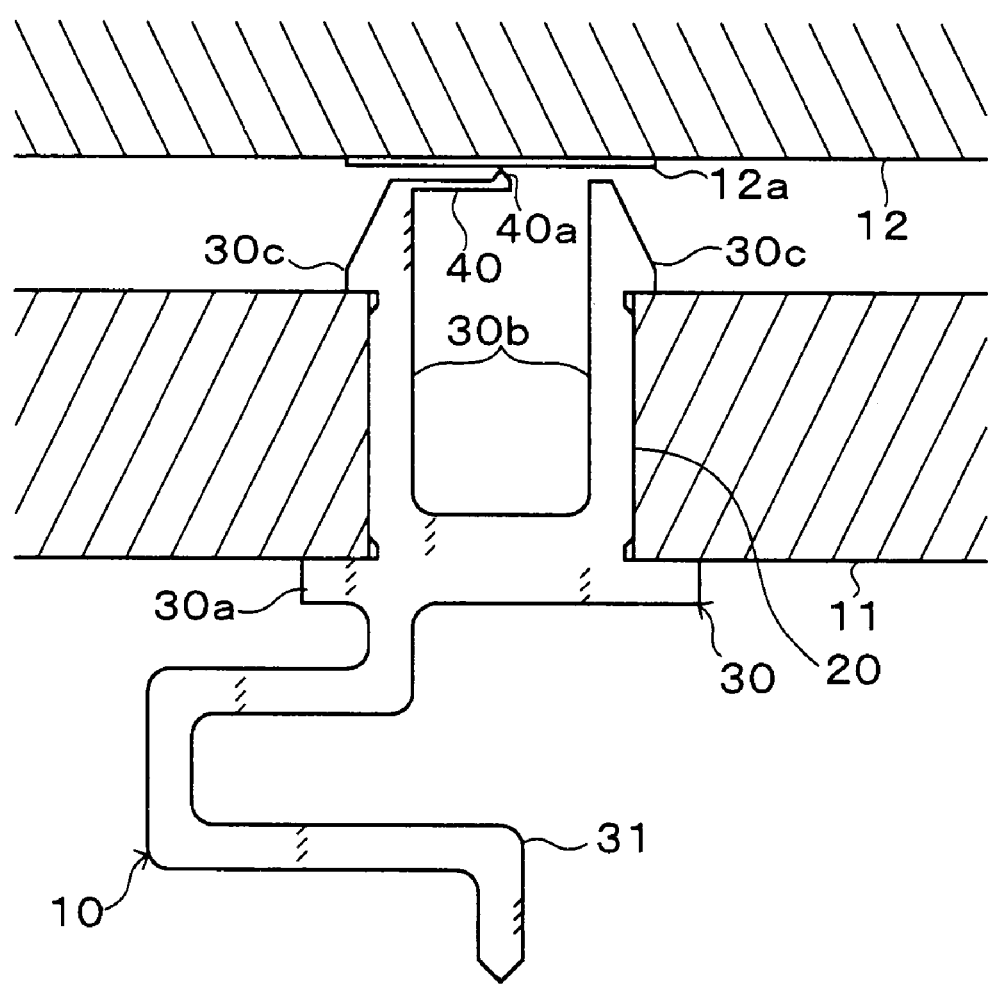
FIG. 5 An explanatory view of a vertical cross-section showing an overview of a probe having a horizontal plate and a structure of an attaching portion of the probe.

On the tip of the fitting/locking portion 30 of the probe 10 described in the above embodiment, a horizontal plate 40 as a member having elasticity may be attached as shown in FIG. 5. The horizontal plate 40 is formed of an electrically conductive material such as metal for example. The horizontal plate 40 is formed thinly and has elasticity in a vertical direction. The horizontal plate 40 is formed to proceed inward from the tip of one of the fitting/locking portions 30 for example, and on an upper face of the tip of the horizontal plate 40, a contact portion 40a having a projecting shape is formed. The connecting terminal 12a of the printed wiring board 12 is made to abut on this contact portion 40a. In this case, when a load is applied from the printed wiring board 12, the horizontal plate 40 bends downward while keeping a contact with the connecting terminal 12a, and thus deformation and bend of the printed wiring board 12 for example are absorbed by the horizontal plate 40. Consequently, since deformation of the printed wiring board 12 will not be transmitted to the contactor 11 and the probe needle 31, the contact of the probe needle 31 with the wafer W becomes stable, and hence the test of electrical characteristics is performed properly.

Figure 6:
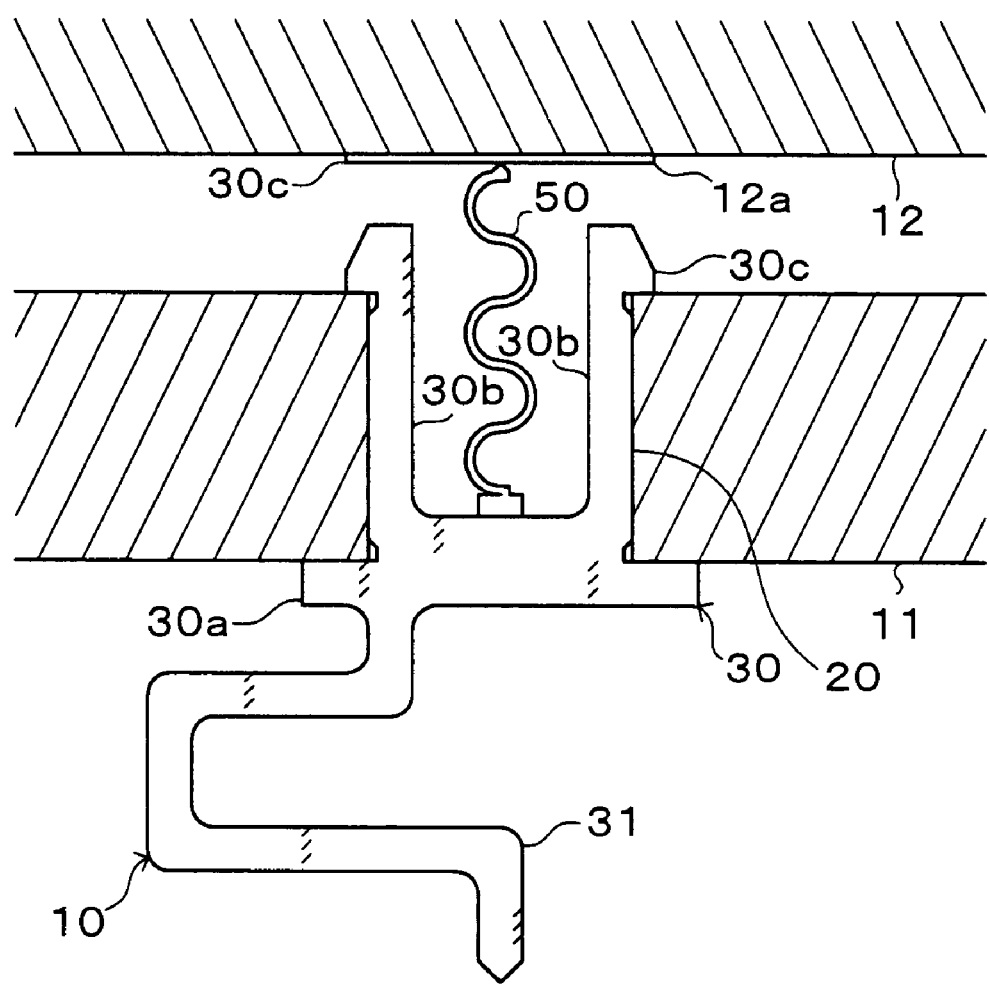
FIG. 6 An explanatory view of a vertical cross-section showing an overview of a probe having a conduction member and a structure of an attaching portion of the probe.

In the above embodiment, the tip of the fitting/locking portion 30 is brought into contact with the connecting terminal 12a of the printed wiring board 12 to realize conduction between the printed wiring board 12 and the probe 10, but the fitting/locking portion 30 may be provided with a separate conduction member. In this case, as shown in FIG. 6 for example, a conduction member 50 formed of an electrically conductive material such as metal is attached to the fitting/locking portion 30. The conduction member 50 is formed in a sine wave form extending in a vertical direction for example, and has elasticity in the vertical direction. For example, the conduction member 50 has a lower end joined to an upper face of a central portion of the base portion 30a of the fitting/locking portion 30. The conduction member 50 passes through the inside of the fitting portions 30b and has an upper end which projects upward farther than the tip of the fitting/locking portion 30 and is in contact with the connecting terminal 12a of the printed wiring board 12. In this case, since the dedicated conduction member 50 is provided, the electrical conduction between the probe 10 and the printed wiring board 12 is performed more stably.

Figure 7:
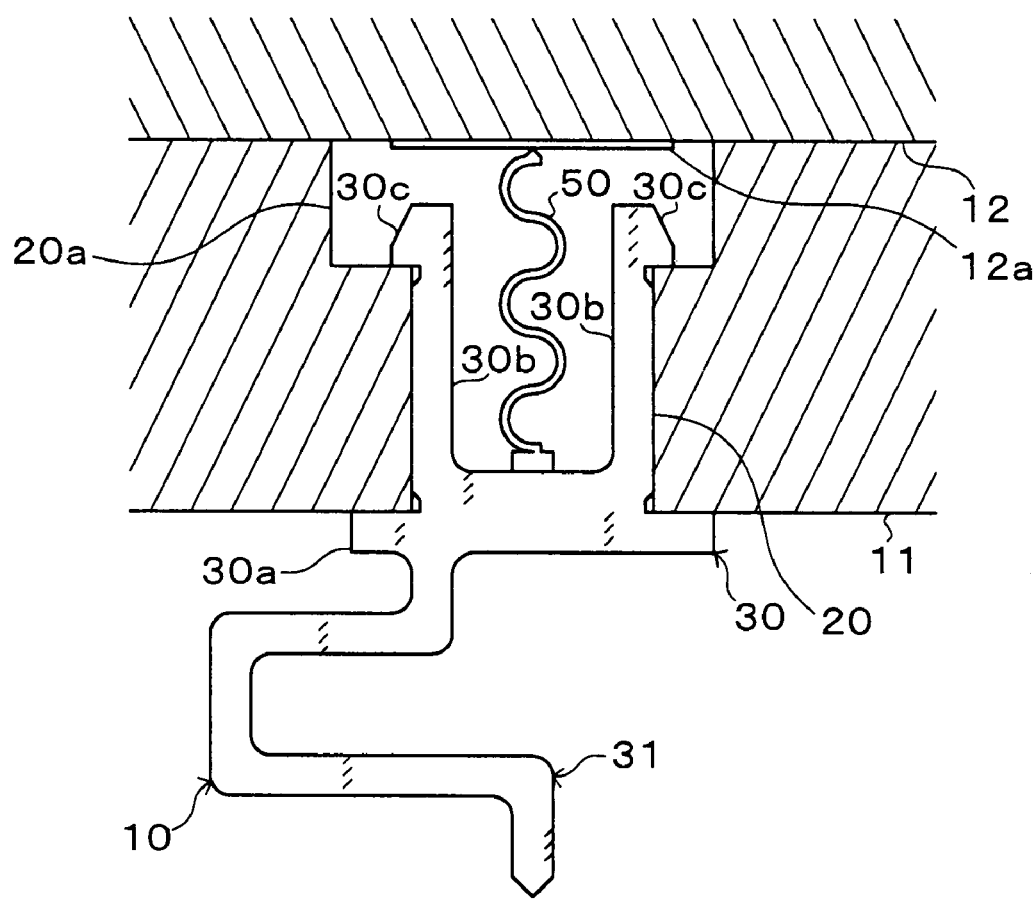
FIG. 7 An explanatory view of a vertical cross-section showing an overview of a probe in the case where a contactor and a printed wiring board are in close contact with each other and a structure of an attaching portion of the probe.

In the above-described embodiment, the contactor 11 and the printed wiring board 12 may be brought into contact with each other, and at an upper part of the through hole 20 of the contactor 11, a square hole 20a larger in diameter than a lower part may be formed, as shown in FIG. 7. On a step portion formed by this square hole 20a, the locking portion 30c of the fitting/locking portion 30 is hooked and locked. In this case, for example adjustment of the gap between the contactor 11 and the printed wiring board 12 becomes unnecessary, and assembly of the probe card 2 becomes easy.

Figure 8:
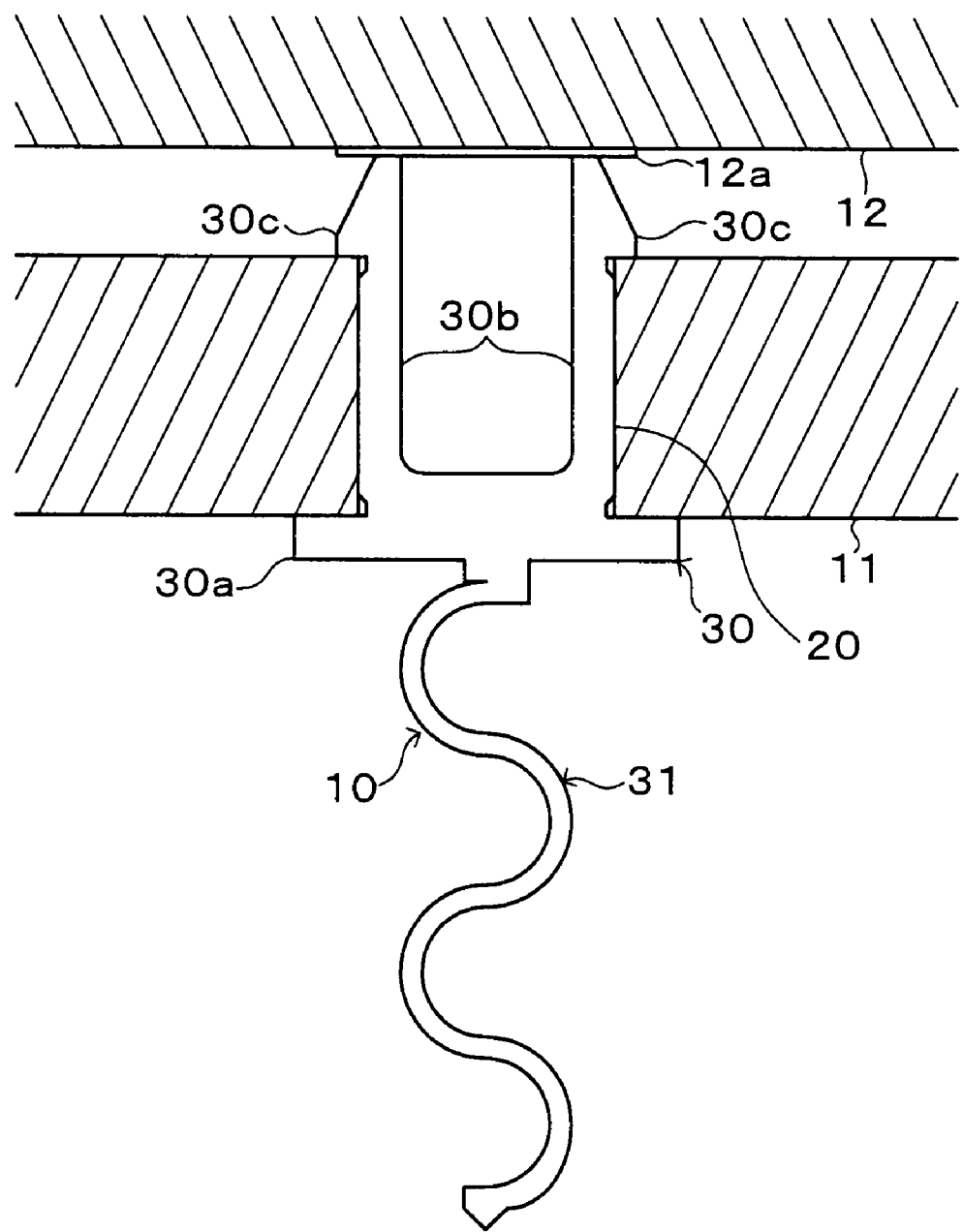
FIG. 8 An explanatory view of a cross-section showing an overview of a probe having a sine wave form and a structure of an attaching portion of the probe.

In the above embodiment, the probe needle 31 of the probe 10 is formed in a shape curving to project in a horizontal direction, but it may be another shape, and for example it may be formed in a sine wave form extending downward as shown in FIG. 8.

As above, one example of the embodiment of the present invention has been described, but the present invention is not limited to this example and can adopt various modes. For example, in this embodiment, the through holes 20 formed in the contactor 11 are square holes, but they may be circular holes. Also, the present invention is also applicable in the case where the object to be tested is a high-density mounted circuit board such as FPD (Flat Panel Display) and MCM (multichip module), other than the wafer W.

INDUSTRIAL APPLICABILITY

The present invention is useful when a probe is attached to a contactor easily within a short time.

What is claimed is:

1. A probe for testing electrical characteristics of an object to be tested, comprising:

a support member for supporting the probe, the support member facing the object to be tested, and the probe being constructed to be freely attachable to the support member by locking in the support member;

a fitting/locking portion for locking the probe in the support member, the fitting/locking portion being fitted into a hole formed in the support member from a side of the object to be tested and locked therein; and a conduction member connected to the fitting/locking portion, the conduction member being formed of an electrically conductive material, wherein the fitting/locking portion includes a base portion which is larger than an opening portion in a longitudinal direction of the hole, and fitting portions having two plates which have flexibility and elasticity in a direction in which the two plates face each other, wherein the fitting/locking portion is formed of an electrically conductive material, and is formed to penetrate the hole in the support member from the side of the object to be tested to an opposite side and to project from a face of the opposite side of the support member, and wherein the conduction member passes through the hole in the support member and projects from the face of the support member opposite to the side of the object to be tested.

2. The probe according to claim 1,
wherein a member formed of an electrically conductive material and having elasticity is attached to a tip of a projecting portion of the fitting/locking portion.

3. The probe according to claim 1, wherein the conduction member has elasticity.

4. The probe according to claim 3, wherein the conduction member is formed in a sine wave form along the projecting direction.

5. A probe for testing electrical characteristics of an object to be tested, comprising:
a support member for supporting the probe, the support member facing the object to be tested, and the probe being constructed to be freely attachable to the support member by locking in the support member; and
a fitting/locking portion for locking the probe in the support member, the fitting/locking portion being fitted into a hole formed in the support member from a side of the object to be tested and locked therein; and
a probe needle which has an upper end connected to the fitting/locking portion and a lower end in contact with the object to be tested,
wherein the fitting/locking portion includes a base portion which is larger than an opening portion in a longitudinal direction of the hole, and fitting portions having two plates which have flexibility and elasticity in a direction in which the two plates face each other,
wherein the fitting/locking portion is formed of an electrically conductive material, and is formed to penetrate the hole in the support member from the side of the object to be tested to an opposite side and to project from a face of the opposite side of the support member, and
wherein the probe needle curves to project in a horizontal direction between the upper end and the lower end.

6. A probe card, comprising:
a support member for supporting a probe on one face and a circuit board facing another face of the support member, the probe being constructed to be freely attachable to the support member by locking in the support member;
a fitting/locking portion for locking the probe in the support member, the fitting/locking portion being fitted into a through hole formed in the support member from a side of the object to be tested and locked therein;
a conduction member connected to the fitting/locking portion, the conduction member being formed of an electrically conductive material; and
a member attached to a tip of a projecting portion of the fitting/locking portion, the member having elasticity and being formed of an electrically conductive material,
wherein the probe is constructed to electrically conduct with the circuit board when attached to the support member, wherein the fitting/locking portion includes a base portion which is larger than an opening portion in a longitudinal direction of the through hole, and fitting portions having two plates which have flexibility and elasticity in a direction in which the two plates face each other,
wherein the fitting/locking portion is formed of an electrically conductive material, and is formed to penetrate the through hole in the support member from the side of the object to be tested to an opposite side, to project from a face of the opposite side of the support member, and to be in contact with the circuit board, and
wherein the conduction member passes through the through hole in the support member, projects from the other face of the support member and comes in contact with the circuit board.

7. The probe card according to claim 6, wherein the conduction member has elasticity.

8. The probe card according to claim 7, wherein the conduction member is formed in a sine wave form proceeding from the one face side to the other face side of the support member.

9. A probe card, comprising:
a support member for supporting a probe on one face and a circuit board facing another face of the support member, the probe being constructed to be freely attachable to the support member by locking in the support member;
a fitting/locking portion for locking the probe in the support member, the fitting/locking portion being fitted into a hole formed in the support member from a side of the object to be tested and locked therein; and
a probe needle which has an upper end connected to the fitting/locking portion and a lower end in contact with the object to be tested,
wherein the probe is constructed to electrically conduct with the circuit board when attached to the support member,
wherein the fitting/locking portion includes a base portion which is larger than an opening portion in a longitudinal direction of the hole, and fitting portions having two plates which have flexibility and elasticity in a direction in which the two plates face each other,
wherein the fitting/locking portion is formed of an electrically conductive material, and is formed to penetrate the hole in the support member from the side of the object to be tested to an opposite side, to project from a face of the opposite side of the support member, and to be in contact with the circuit board, and
wherein the probe needle curves to project in a horizontal direction between the upper end and the lower end.

10. The probe card according to claim 6, wherein the through hole a quadrangular shape formed in the support member;
said fitting/locking portion has a locking portion formed in each of said fitting portions and locked in the support member; and
said fitting portions are fitted along inner wall faces facing each other in said through hole.

11. The probe card according to claim 10, wherein the locking portion is locked in the support member by hooking to an end face on the other face side in the through hole.

* * * * *